United States Patent [19]

Jambotkar

[11] Patent Number: 5,064,772
[45] Date of Patent: Nov. 12, 1991

[54] BIPOLAR TRANSISTOR INTEGRATED CIRCUIT TECHNOLOGY

[75] Inventor: Chakrapani G. Jambotkar, Hopewell Junction, N.Y.

[73] Assignee: International Business Machines Corporation, Armonk, N.Y.

[21] Appl. No.: 577,457

[22] Filed: Sep. 4, 1990

Related U.S. Application Data

[62] Division of Ser. No. 238,830, Aug. 31, 1988, Pat. No. 4,967,253.

[51] Int. Cl.$^5$ .......................................... H01L 21/265
[52] U.S. Cl. .................................... 437/31; 437/184; 437/228; 437/944; 437/984; 437/985; 357/16; 357/34; 148/DIG. 10; 148/DIG. 11; 148/DIG. 72
[58] Field of Search .............. 437/31, 184, 944, 228, 437/984, 985; 148/DIG. 10, DIG. 11, DIG. 72; 357/16, 34

[56] References Cited

U.S. PATENT DOCUMENTS

| | | | |
|---|---|---|---|
| 4,063,992 | 12/1977 | Hosack | 437/985 |
| 4,195,307 | 3/1980 | Jambotkar | 357/56 |
| 4,380,774 | 4/1983 | Yoder | 357/34 |
| 4,428,111 | 1/1984 | Swartz | 29/576 E |
| 4,593,305 | 6/1986 | Kurata et al. | 357/34 |
| 4,593,457 | 6/1986 | Birrittella | 29/576 B |
| 4,611,388 | 9/1986 | Pande | 29/576 E |
| 4,617,724 | 10/1986 | Yokoyama et al. | 29/576 B |
| 4,654,960 | 4/1987 | McLevige et al. | 29/576 B |
| 4,670,767 | 6/1987 | Ohta | 357/34 |
| 4,679,305 | 7/1987 | Morizuka | 357/16 R |
| 4,683,487 | 7/1987 | Ueyanagi et al. | 357/16 X |
| 4,731,340 | 3/1989 | Chang et al. | 437/944 |
| 4,780,427 | 10/1988 | Sakai et al. | 437/33 |
| 4,839,303 | 6/1989 | Tully et al. | 437/31 |
| 4,868,613 | 9/1989 | Hirachi | 357/34 X |
| 4,889,821 | 12/1989 | Selle et al. | 437/32 |
| 4,889,831 | 12/1989 | Ishii et al. | 437/31 |

FOREIGN PATENT DOCUMENTS

| | | | |
|---|---|---|---|
| 0177246 | 4/1986 | European Pat. Off. | 357/34 HB |
| 61-137364 | 6/1986 | Japan | 357/34 HB |
| 62-5659 | 1/1987 | Japan | 357/34 HB |
| 62-18762 | 1/1987 | Japan | 357/34 HB |

OTHER PUBLICATIONS

Asbeck et al., "4.5 GHz Frequency Dividers Using GaAs/(GaAl) As Hetero-Junction Bipolar Transistors", International Solid State Circuits Conf., Feb. 22, 1984, pp. 50–51, Digest of Technical Papers.
IEEE Electron Device Letters, vol. EDL-5, No. 8, Aug. 1984, "GaAs/(Ga,Al)As Heterojunction Bipolar Transistors with Buried Oxygen-Implanted Isolation Layers," Asbeck et al., p. 310.
International Electron Devices Meeting, Washington, D.C., Dec. 8–10, 1980, p. 823, "Self-Aligned NPN Bipolar Transistors" by Ning et al.
IEEE Electron Device Letters, vol. EDL-7, No. 12, Dec. 1986, p. 694, "Emitter-Base-Collector Self-Aligned Heterojunction Bipolar Transistors Using Wet Etching Process" by Eda et al.

Primary Examiner—Brian E. Hearn
Assistant Examiner—Kevin Picardat
Attorney, Agent, or Firm—Donald M. Boles; Alvin J. Riddles

[57] ABSTRACT

An integrated circuit bipolar transistor is described wherein the relative semiconductor electrode areas are established by an electrode pedestal that includes a base contact positioning feature and wiring constraints are relaxed by a base pedestal that facilitates the positioning of contact wiring that is independent of contact location. A heterojunction bipolar transistor having a base area less than twice as large as the emitter area is described.

10 Claims, 4 Drawing Sheets

22 BASE CONTACT
21 EMITTER
20
23 GLOBAL BASE CONNECTION
24 GLOBAL EMITTER CONNECTION

BIPOLAR TRANSISTOR INTEGRATED CIRCUIT TECHNOLOGY

This application is a division of Application Ser. No. 07/238,830 filed 8/31/88 now U.S. Pat. No. 4,967,253.

DESCRIPTION

1. Field of the Invention

The invention is directed to the structure and fabrication of bipolar transistors in integrated circuits.

2. Background of the Invention

Integrated circuits typically consist of thousands of transistors which are built into and interconnected on large substrates. In their fabrication, consisting of many operations, cumulative structural and locational tolerances limit precision and result in some loss of electrical performance of the transistors. This is particularly true in the case of bipolar transistors where, for example, the collector electrode is in the substrate crystal, the base and emitter electrodes being epitaxially arranged above it. In such a structure, one must consider not only lithographic limitations in positioning but also as to how relative areas of electrodes affect device parameters.

In the prior art, some consideration has been given to the relative size of the base, which, in turn, directly affects base-to-collector capacitance. The ideal relative sizes would be that the base-to-collector area be the same as the base-to-emitter area.

In U.S. Pat. No. 4,380,774, the collector is implanted with ions so there remains only an active region that coincides with the emitter area.

In U.S. Pat. No. 4,428,111, there is grown a base and emitter on a collector region, the base being very thin. Side layers of the same conductivity as the base serve as contacts and control relative areas.

In U.S. Pat. No. 4,593,305, control is achieved by control of doping adjacent to the junctions.

In Asbeck et al, IEEE Electron Device Letters Vol. EDL-5, No. 8, Aug. 1984, p.310, $O_2$ is implanted under the extrinsic base to keep the base area to the emitter size.

SUMMARY OF THE INVENTION

The invention provides an integrated bipolar transistor wherein the area of the base region is made extremely small, being less than twice the area of the emitter. A device construction involving two pedestals is employed wherein one pedestal establishes base size and the other pedestal establishes external base connection location to facilitate global wiring. The invention is particularly advantageous in bipolar heterojunction transistor technology.

BRIEF DESCRIPTION OF THE DRAWINGS

FIGS. 4 through 13 illustrate intermediate steps in the application of the principles of the invention to the fabrication of a heterojunction bipolar transistor integrated circuit wherein:

FIG. 4 is a multilayer substrate with an electrode pedestal thereon;

FIG. 5 is the structure of FIG. 4 with a temporarily formed material surrounding the pedestal;

FIG. 6 is the structure of FIG. 5 after area reduction of the electrode pedestal with base electrode spacing overhang;

FIG. 7 is the structure of FIG. 6 with the electrode pedestal area reduction protected with a material resistant to an erosion operation exercised on the material applied at the stage of FIG. 5;

FIG. 8 is the structure of FIG. 7 wherein isolation is provided adjacent the electrode pedestal;

FIG. 9 is the structure of FIG. 8 wherein the isolation is eroded to provide access to a buried layer;

FIG. 10 is the structure of FIG. 9 with metal contacts to the base;

FIG. 11 is the structure of FIG. 10 with conformal insulation and planarization coatings;

FIG. 12 is the structure of FIG. 11 with the coatings partially removed to expose the pedestal electrode; and FIG. 13 is the structure of FIG. 12 wherein contact openings have been placed in the insulation coatings and metallization has taken place.

DESCRIPTION OF THE INVENTION

The invention provides an integrated circuit bipolar transistor wherein the area of the base region is realized to be extremely small, being less than twice the area of the emitter.

The relative areas are established by a first or electrode pedestal that includes a base contact positioning feature and device interconnection or global wiring constraints are relaxed by a second or base pedestal that facilitates the positioning of the global wiring.

Figure 1:
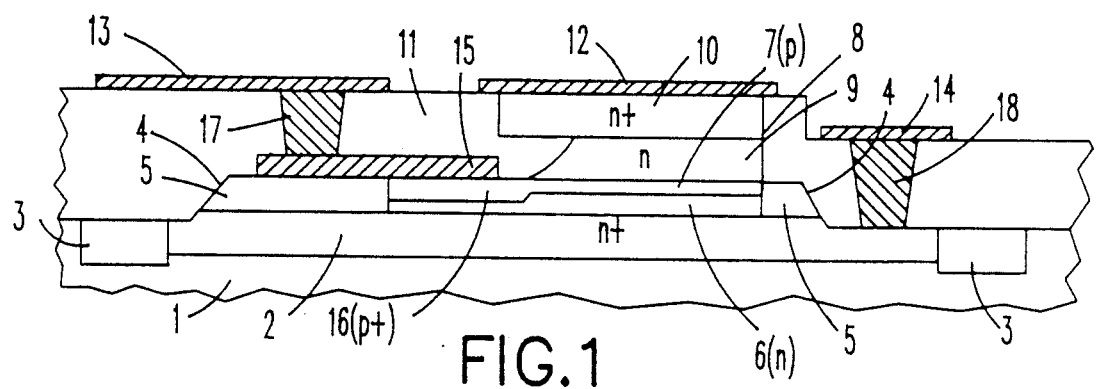
FIG. 1 is a cross sectional schematic view of the novel structure along with processing principles.

Referring to FIG. 1 there is depicted a cross sectional view of a bipolar transistor illustrating the principles of the invention. Using for clarity an arbitrary n and p conductivity type assignment, there is a substrate 1 on which is provided n-type collector region 2 surrounded by isolation region 3. On the collector 2 there is provided a base pedestal 4 having an isolation region 5 bounding an n type region 6 of the collector 2 forming a base to collector junction with a p type intrinsic base region 7, contains electrode pedestal 8 containing an n type portion of the emitter 9/forming an emitter to base junction with the region 7. There is an n+ emitter contacting portion 10 interforms with emitter 9. Insulation 11 supports global device interconnecting wiring 12, 13 and 14 for emitter, base and collector, respectively. The two pedestal structure permits separation of the global wiring 12, 13 and 14 even though the base contact 15 and the p+ extrinsic base portion 16 of base region 7 are positioned in close physical proximity to the emitter 9. Base reachthrough 17 connects base contact is with the global interconnected wiring 13. Similarly, collector reachthrough 18 connects the collector region 2 with the global collector interconnect wiring 14.

The vertical differentiation in the insulating material 11 at the collector contact provides reduced constraints in positioning the global collector interconnect wiring 14 through the reduced thickness and that reduced thickness also facilitates the collector contact 18 reachthrough.

Figure 2:
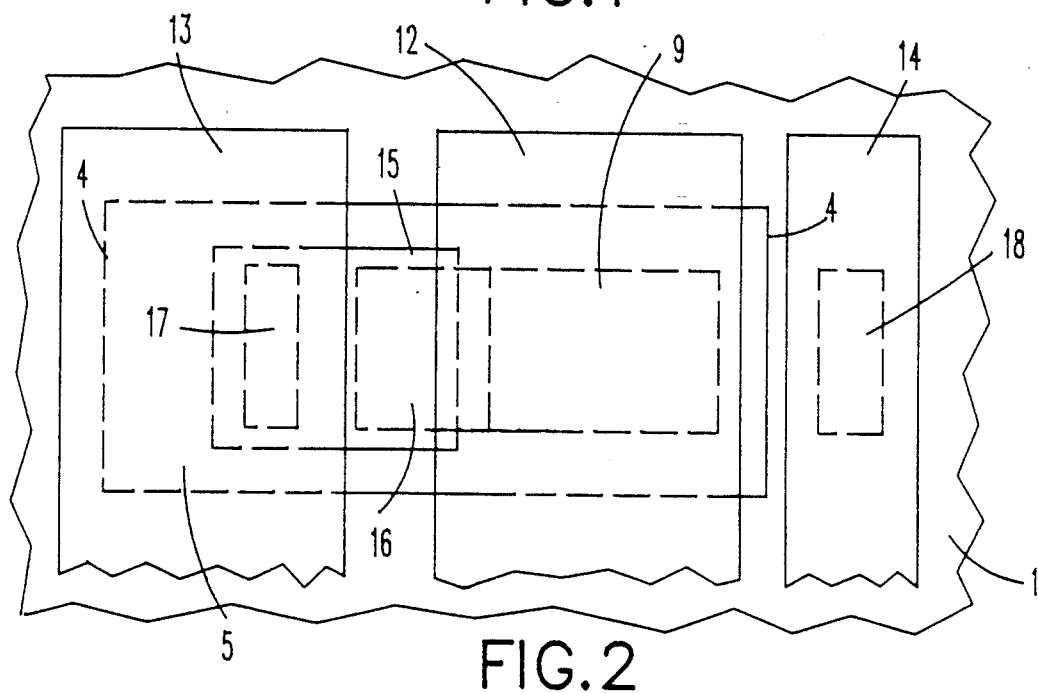
FIG. 2 is a plan view of the same structure.

The invention is shown in a plan view in FIG. 2 which is dimensionally correlated with FIG. 1 using the same reference numerals. The figure depicts the global wiring 12, 13 and 14 which is separated relatively widely in accordance with the constraints of lithographic capability, while the base contact 15 and p+ region 16 are located very close to the emitter 9 area of pedestal 8.

Figure 3:
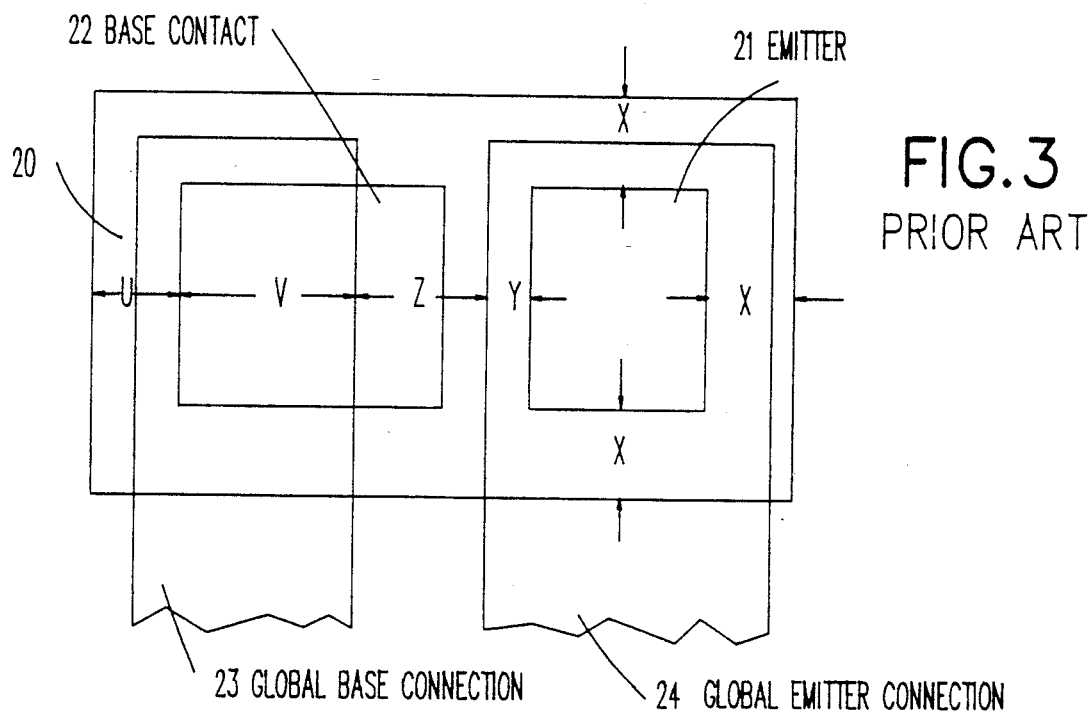
FIG. 3 is a plan view illustrating the interrelationship of electrode and wiring dimensions in bipolar transistor integrated circuits of the prior art.

The structure and process of the invention provides transistors with the smallest possible base area. Typically, this base area and therefore the collector base capacitance will be one-third that in a conventional transistor, this resulting in an appreciable improvement in the transistor performance. An illustration of this is shown in FIG. 3, in connection with the prior art. It is well known in the art that the base collector capacitance has a strong influence on the switching performance of a bipolar transistor. As illustrated in FIG. 3, in transistor structures of the prior art, the base surrounding the emitter occupies an appreciable area. This surrounding area arises out of a number of considerations, a main one being the necessity of allowance for various lithography tolerances.

Referring to FIG. 3, the overall base area is labeled 20 and the emitter area is labeled 21, the base contact is labeled 22 and the global base connection is labeled 23 whereas the emitter global connection is labeled 24. In this type of prior art construction, dimensions X, Y, Z, V and U were for all practical purposes area losses governed primarily by lithography limitations. The dimension X is the overlap of the base window edge relative to the emitter edge to allow for edge to edge misregistration. The dimension Y is the overlap of the global metal for the emitter relative to the emitter edge which is necessary for reliability reasons. The dimension Z is the space between global metals for base and emitter connections. The dimension V is the width necessary for contact between the global metal and the connection to the base and the dimension U is the overlap of the base window edge relative to the base contact metal to prevent the contact metal from shorting to regions outside the base.

Under these prior art conditions, the base area, A, would follow the expression shown in Equation 1. A +($L_E$ +2X) ×(U +V +Z +Y +X +$W_E$) where $L_E$ and $W_E$ are emitter length and width, respectively. As a practical example, assuming the value of U, V, X, Y and Z to be 0.6, 0.9, 0.6, 0.6 and 1.5 -1.8 microns, respectively, for a typical 3 × 1.5 micron squared emitter, the total base area would be of the order of 25.2 microns for a Z value of 1.8 microns.

In contrast, in accordance with the invention, while the intrinsic base occupies an area equal to that of the emitter, the length of the extrinsic base area is equal to the length of the emitter, and the width of the extrinsic base area is the amount necessary for contact with the p contact metal, viz. typically about nine-tenths of a micron. The result is that the base area is typically about 7.7 square microns.

In accordance with the principles of the invention, the invention will be described with the help of FIGS. 4-13 in connection with a heterojunction bipolar transistor (HBT) wherein specific conductivity types and particular compound semiconductor materials will be employed However, in the light of the principles of the invention, many substitutions will occur to one skilled in the art.

The process described using FIGS. 4-13 produces heterojunction bipolar transistors which have the smallest possible base area. Compared to a conventional transistor, the process of this invention enables the base area to be shrunk to about a third, for a given emitter size, and the collector-base capacitance diminishes by the same factor.

Employing the process of the invention the large reduction in base area is attained through triple self-alignment of the base edges with respect to the emitter edges. Placement of the base contact metal is only two-tenths of a micron away from one of the four edges of the emitter and self-aligned placement of an isolation region outside the base area on all four sides of the device removes the constraint of dimension U identified in FIG. 3. In other words, the base contact metal can extend beyond the base area as much as necessary in order to provide a connection to the global base metal without creating base to collector short circuits.

Figure 4:
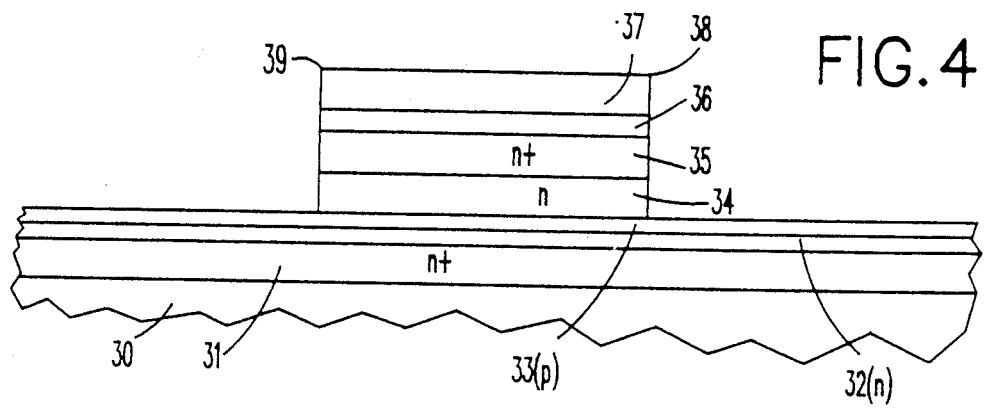

Referring to FIG. 4, a conventional starting structure is provided on a wafer 30 consisting of a monocrystalline compound semiconductor such as GaAs. The wafer 30 consists of a layer 31 of, for example, N+GaAs, a layer 32 of N GaAs or AlGaAs, a layer 33 of P GaAs, a layer 34 of N AlGaAs and finally a layer 35 of N+GaAs, grown sequentially using the technique of metal organic chemical vapor deposition (MOCVD) or molecular beam epitaxy (MBE), as is standard in the art. Using the technique of chemical vapor deposition (CVD), a layer 36 of $Si_xN_y$ followed by a layer of polysilicon 37 is then provided over the layer 35.

Through the use of lithography and etching, layers 37, 36, 35 and 34 are removed beyond the edges 38 and 39 so that a first or electrode pedestal is created. This pedestal establishes the area of the emitter.

While the FIGS. 4-13 are shown in cross section as is conventional in the art, it will be apparent to one skilled in the art that the cross sectional structure of the pedestal also has a third dimension.

Figure 5:
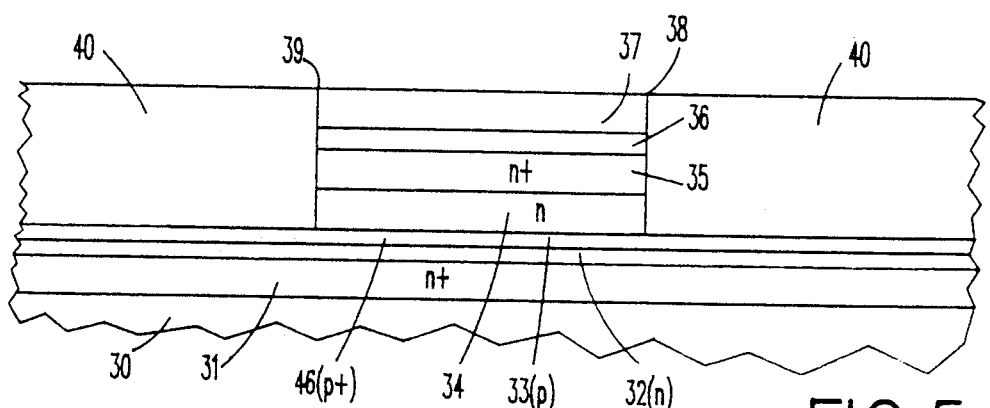

Using for example chemical vapor deposition, a conformal layer of $SiO_x$ 40 in FIG. 5, is deposited surrounding the pedestal which was made up of layers 34-37. This is followed by a planarizing coating of polyimide, not shown. An etch back technique, using, for example $CF_4$ reactive ion etching (which etches $SiO_x$ and polyimide or resist at practically the same rate), or ion milling which also removes the two materials at the same rate, is employed next so that the structure of FIG. 5 is produced when the etch back is stopped when the top surface of layer 37 is just exposed.

Figure 6:
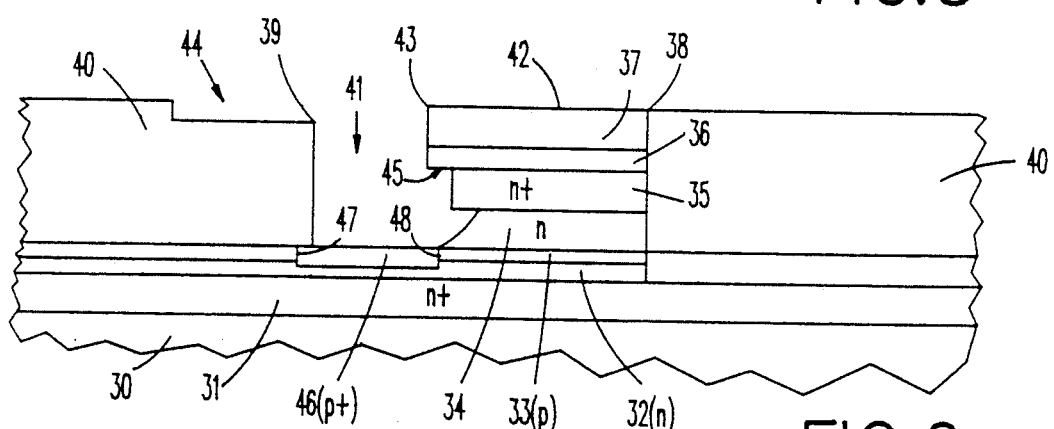

Referring to FIG. 6, an opening 41 follows the face 39 and removes from the first pedestal all material except that defined by the area 42 which will equal the size of the emitter of the device being manufactured. This is done as follows:

An oversized photoresist mask, not shown, is applied over the surface of the structure of FIG. 5 such that the portion (between 39 and 43 of FIG. 6) of the first pedestal, that is to be removed, is exposed. The layer 37 of polysilicon is first etched away using, for example, an $SF_6/Cl_2$ ion etch which has a very low etch rate for silicon oxide.

Following this and using the same mask, the silicon nitride layer 36 is then etched through by changing the reactive ion etch to, for example, $CF_4$. This etch removes a portion of the exposed silicon oxide 40 in the area 44 but this is of no particular consequence since the silicon oxide 40 substantially remains in place because of its thickness.

Retaining the same photoresist mask, the N+layer 35 of GaAs is then etched through using, for example $CCl_2F_2$+He as a reactive ion etch, followed by an isotropic plasma etch, with the same etchant, so as to create an, about 0.2 micron wide, undercut 45. The etching of the opening 41 is continued to remove layer 34 using, for example, wet etching or plasma etching. Through the opening 41, implantation of, for example, magnesium ions is next performed so as to produce the extrinsic base P+region 46 in the layer 33, preferably extending slightly laterally at 47 and 48 and below into layer 32.

Conductivity type and material labeling designations have been included in the figures to assist in correlating the explanation of the device being manufactured.

In the activation of the dopant in the region 46 capless AsH$_3$ annealing, or annealing following vapor deposition of a thin, about 500 Angstroms, silicon nitride, cap on the surface of the wafer may be performed. Where the thin cap is used, it is removed after annealing using, for example, CF$_4$ plasma etching.

A coating of planarizing polyimide or resist is applied next. It is subjected to an O$_2$ etch back so as to provide the structure depicted in FIG. 7, where the region 49 of polyimide or resist is filling the opening 41 and the area 42 on the polysilicon is exposed.

Figure 7:
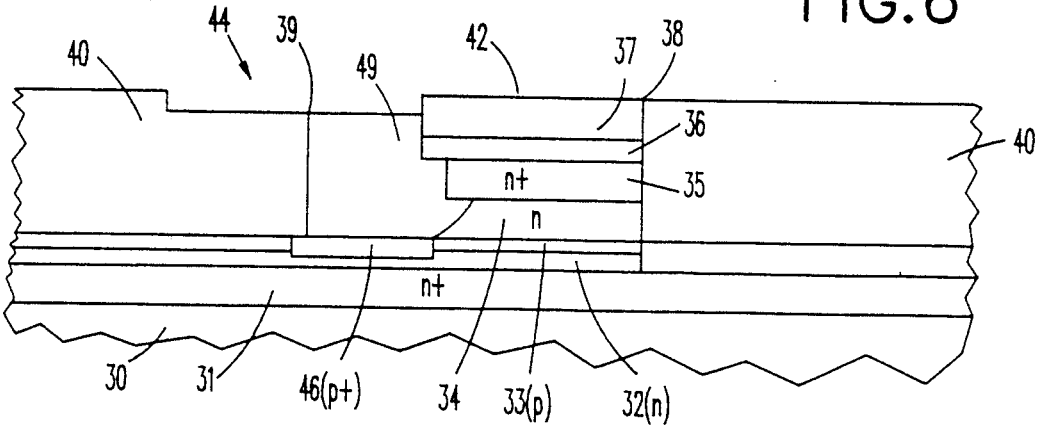
Figure 8:
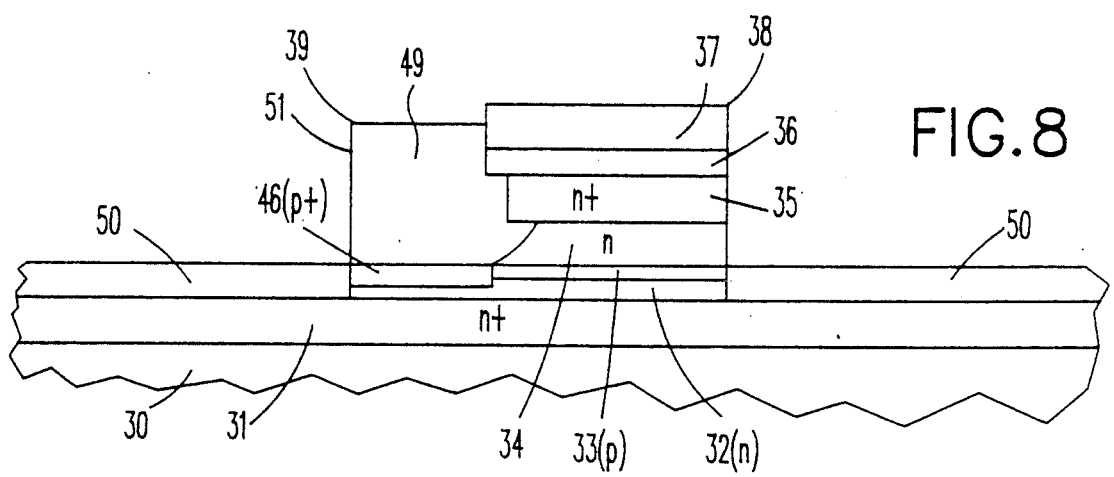

Referring next to FIG. 8, the silicon oxide 40 of FIG. 7 and earlier is removed using, for an example, buffered HF wet etching. This is followed by an implantation of ions such as boron, hydrogen or oxygen, which form isolation regions 50, using as boundaries the interface 38 and the interface 51 of the polyimide or resist 49.

At this point, the first pedestal of the invention is complete which provides the emitter area 34.

Figure 9:
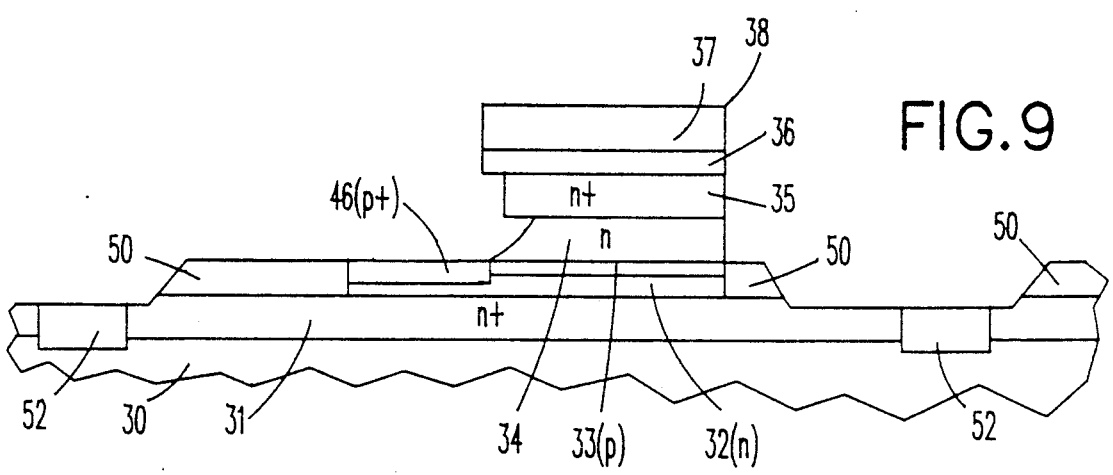

Referring next to FIG. 9, the polyimide or resist 49 is removed, and then by lithography and etching, portions of the isolation 50 is etched down so as to expose the layer 31. Isolation regions 52 which define the subcollector boundary are next formed through ion implantation of boron, hydrogen or oxygen.

Figure 10:
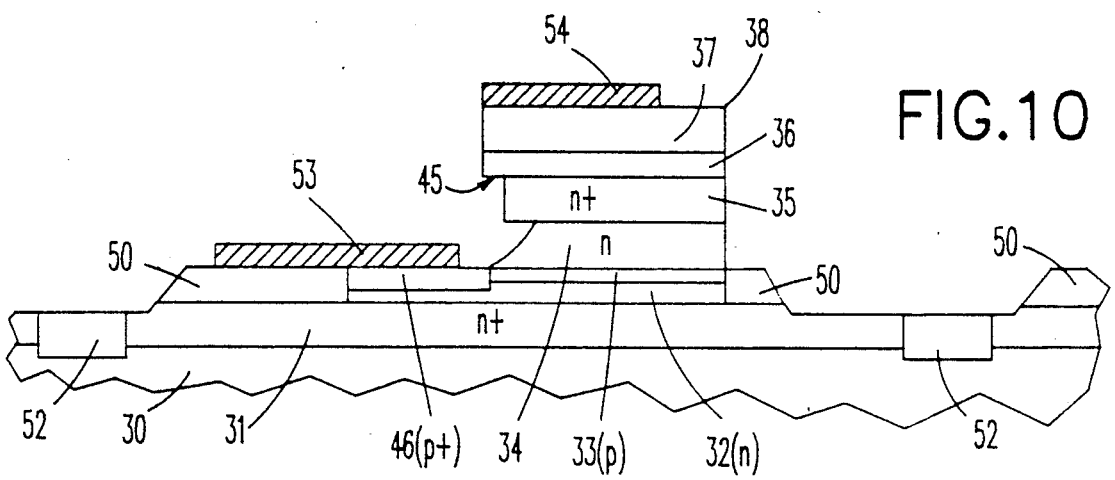

Referring next to FIG. 10, employing the standard liftoff technique well known in the art, a metal system, such as gold/manganese, is evaporated to serve as the contact 53 to the extrinsic portion 46 of the base. In the standard liftoff technique in the art, some of the metal evaporated during formation of contact 53 will fall above layer 37 as element 54 and the contact will thus be delineated at its edge by the ledge 45 built-in in accordance with FIG. 6.

Figure 11:
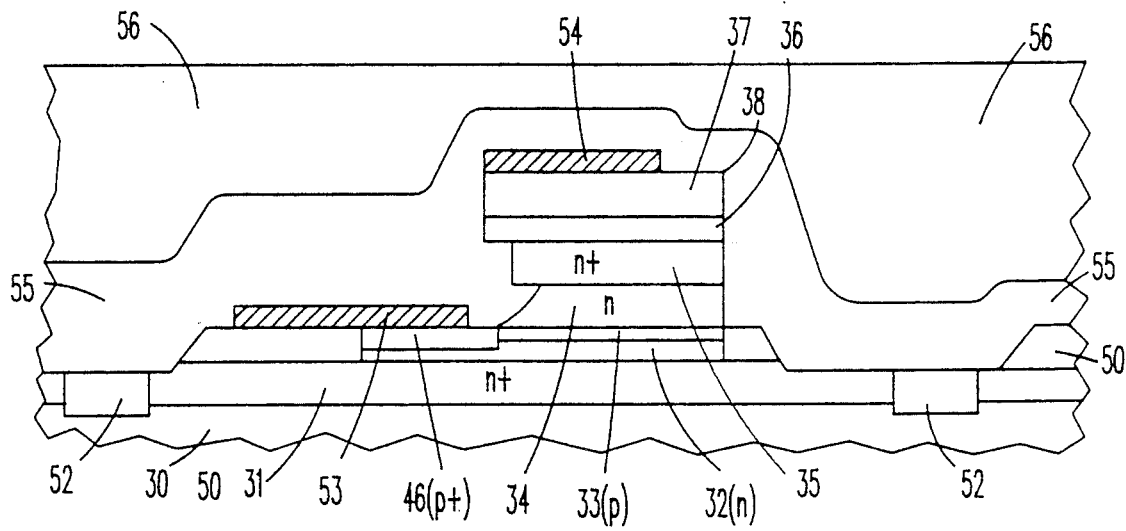
Figure 12:
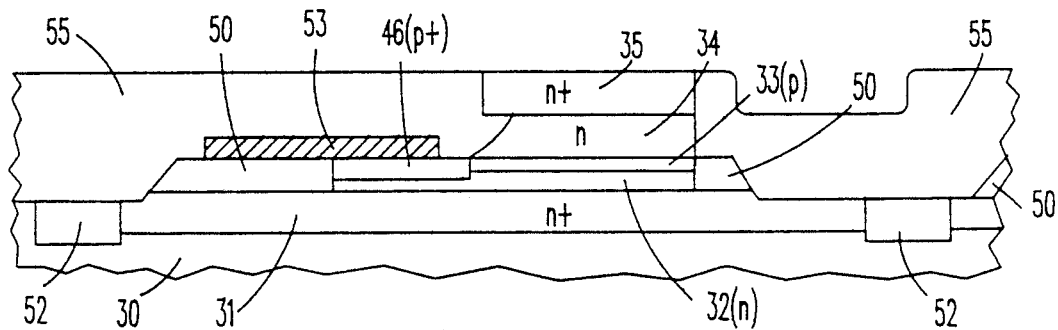

Referring next to FIG. 11, employing a technique such as chemical vapor deposition, a layer of insulating Si$_x$N$_y$ or SiO$_x$ 55 is placed over the structure fabricated thus far. Over the insulating layer 55, a planarizing layer 56 of polyimide or resist is applied.

Employing the etch-back technique which is standard in the art, the polyimide layer 56 and Si$_x$N$_y$ or SiO$_x$ layer 55 are etched back at practically same etch rate using, for example, CF$_4$ reactive ion etching, until the metal layer 54 becomes exposed. The technique of ion milling is next employed to remove the metal 54. Thereafter, the polysilicon layer 37 and the silicon nitride layer 36 may be removed by using CF$_4$ reactive ion etching producing the structure of FIG. 12.

Figure 13:
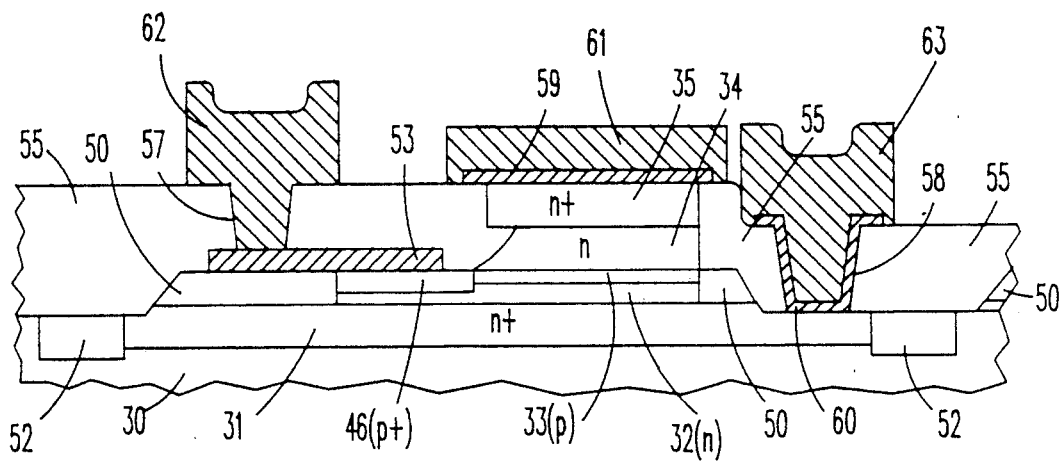

Referring next to FIG. 13, the device is completed using lithography to etch contact holes 57 and 58 through the insulating layer 55 for the base contact and for the collector contact.

Through the technique of lift-off well known in the art, n contact metal 59 and 60 is applied to the emitter and the collector, respectively. Finally, through lithography and the technique of lift-off and standard deposition, the patterns for the global wiring 61, 62 and 63 for the emitter, base and collector, respectively, are laid down.

In the structure of FIG. 13, the extrinsic base contact metal 53 is positioned extremely close to the emitter as governed by the overhang technique described in connection with FIG. 6.

The first or electrode pedestal thus governs the size of the base and the spacing of the base contact. The second or base pedestal bounded by isolation region 50 operates to provide support for element 53 when extended to permit the movement of the global metal 62.

BEST MODE OF CARRYING OUT THE INVENTION

In the structure of FIG. 13, the substrate 30 would be GaAs, the collector layer would be N+ GaAs approximately 5,000 Angstroms in thickness, the collector layer 31,32 would be one of either N GaAs or N AlGaAs about 4,000 Angstroms in thickness. The base layer 33 would be P GaAs approximately 1,000 Angstroms thick. The emitter layer 34 would be N AlGaAs about 1.500 Angstroms thick and the emitter layer 35 would be N+ GaAs about 1,500 Angstroms thick. The base contact metal 53 would be gold/manganese and the contact metal for the emitter 59 and the collector 60 would be gold/germanium/nickel. The global interconnection metal 61, 62 and 63 would be aluminum with a suitable barrier metal layer such as TiW.

In the structure of FIG. 13, the first pedestal provided an emitter region typically 3.0 microns by 1.5 microns. The base region, including the extrinsic region 46, would be typically about 8 microns.

What has been described is a structure and a technique of fabrication of a bipolar transistor wherein the area of the base region is extremely small, being equal to less than twice the area of the emitter wherein a first pedestal is formed that both establishes a minimal intrinsic base size with respect to the emitter size and facilitates the positioning of the base contact metal on an extrinsic portion of the base in close proximity to the emitter and a second pedestal which provides support for extending the base contact metal to facilitate positioning of global interconnection metals.

Having thus described my invention, what I claim as new and desire to secure by Letters Patent is:

1. In the fabrication of a bipolar transistor of the type wherein in a monocrystalline semiconductor body having at least a buried electrode contacting layer, a first electrode layer, a base layer and a second electrode layer, respectively, in superposed epitaxial relationship, the method comprising:

forming a base area controlling pedestal by
  removing first a portion of said layers at least through said second electrode layer exposing thereby said base layer and leaving remaining an area equal to the combined intrinsic and extrinsic base region designed for the transistor being fabricated,
  removing second a further portion of said remaining area of said portion of said layers at least through said second electrode layer, said further portion leaving remaining the designed second electrode area of the transistor being fabricated, exposing thereby the portion of said base electrode to be the extrinsic base,
  said second removal step including means for locating the extrinsic to intrinsic base interface, and
  converting said extrinsic portion of said base to high conductivity,
forming a wiring accommodation pedestal by removing said base and said first electrode layers down to said electrode contacting layer in the area outside the combined area of said intrinsic and said extrinsic base regions, surrounding said superposed base layer and said first electrode layer combination with an isolating material member, providing a high conductivity base connection to said extrinsic portion of said base in a location extending over a portion of said isolating material member, providing insulation over the transistor structure, and providing a global wiring member for each of said first, said second and said base electrodes positioned on and having a connection through said insulation.

2. The process of fabricating a bipolar transistor of the type wherein in a monocrystalline semiconductor body having at least a buried electrode contacting layer, a first electrode layer, a base layer and a second electrode layer, respectively, in superposed epitaxial relationship, comprising the steps of forming an area controlling pedestal by removing first, a portion of said layers at least through said second electrode layer exposing thereby said base layer and leaving remaining an area equal to the combined intrinsic and extrinsic base region designed for the transistor being fabricated, covering the exposed surface of said base layer with a first resist material, removing second, a further portion of said remaining area of said portion of said layers at least through said second electrode layer, said further portion leaving remaining the designed second electrode area of the transistor being fabricated, exposing thereby the portion of said base electrode to be the extrinsic base, said second removal step including means for locating the extrinsic to intrinsic base interface, converting said extrinsic portion of said base to high conductivity, forming a base contact pedestal by covering said exposed surface of said extrinsic portion of said base with a second resist material, p2 removing said first resist material, converting the exposed portion of said base layer into an isolation region, removing peripheral portions of said base and said first electrode layers down to said buried electrode contacting layer in the area outside the combined area of said intrinsic and said extrinsic base regions, converting an annulus surrounding said exposed portion of said buried electrode contacting layer into an isolating region, evaporating metal through a mask to provide a metal connection to said extrinsic portion of said base in a location extending over a portion of said isolating region, providing insulation over the structure, providing a planarizing material over said insulation, etching said planarizing material and said insulation to expose the surface of said second electrode layer, providing a metal connection to each of said first, said second and said base electrodes through vias in said insulation, and providing global wiring connections to each said metal electrode connections.

3. The process of claim 2 wherein said converting step employs ion implantation.

4. The process of claim 3 wherein said first resist material is silicon oxide.

5. The process of claim 4 wherein said second resist material is a plastic material.

6. A method for forming a heterojunction bipolar transistor comprising:

providing GaAs substrate having superposed thereon epitaxial layers of N+ GaAs, N type of the group of GaAs and AlGaAs and P type GaAs, respectively, said layers masked in part by a stack composed of superposed layers of N AlGaAs, N GaAs, insulator and polysilicon layers, respectively, said stack having substantially vertical surfaces and an area equal to the area of the emitter of said transistor;

forming a first resist material surrounding said stack and substantially coplanar therewith;

forming a mask in correspondence with the desired region of the extrinsic base of said transistor;

etching said stack not covered by said mask to expose the desired extrinsic base region in said P GaAs layer and concurrently transform the N AlGaAs and N+ GaAs layers thereof into the emitter of siad heterojunction bipolar transistor and said insulator and polysilicon layers thereof into an emitter mask provided with an overhang;

forming by P implantation the extrinsic base in said desired base region;

covering said extrinsic base with polyimide substantially to the level of said polysilicon obtaining substantially vertical walls thereof;

removing said resist material surrounding first resist material;

forming isolation regions in said N GaAs and P GaAs layers, self-aligned to the edges of said polyimide and remnant of said stack;

depositing self-aligned base contact metal on said extrinsic base and a portion of said isolation region around said extrinsic base while laterally spacing said metal at a distance from said emitter by virtue of said overhang;

depositing a conformal layer of an insulating material, applying a planarizing plastic over said insulating material, etching said planarizing plastic and insulating material to the level of said emitter;

establishing metal contacts to said emitter and collector through deposition of a metal; and applying global wiring members for each of said emitter, base and collector.

7. The method of claim 6 wherein said conformal layer of insulating material is silicon nitride.

8. The method of claim 7 including in said metal contact establishing step the step of forming via holes for said collector and said base.

9. The method of claim 8 wherein said first resist material is silicon oxide.

10. The method of claim 9 wherein the metal in said metal contact establishing step is AuGeNi.

* * * * *